United States Patent
Tsai

(10) Patent No.: US 9,548,291 B2
(45) Date of Patent: Jan. 17, 2017

(54) PHOTOMASK AND SEMICONDUCTOR STRUCTURE

(71) Applicant: MACRONIX International Co., Ltd., Hsinchu (TW)

(72) Inventor: Feng-Nien Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 156 days.

(21) Appl. No.: 14/582,913

(22) Filed: Dec. 24, 2014

(65) Prior Publication Data

US 2016/0190116 A1    Jun. 30, 2016

(51) Int. Cl.
*G03F 1/36* (2012.01)
*H01L 27/02* (2006.01)
*H01L 21/027* (2006.01)

(52) U.S. Cl.
CPC ............. *H01L 27/0207* (2013.01); *G03F 1/36* (2013.01); *H01L 21/0274* (2013.01)

(58) Field of Classification Search
CPC ..... G03F 1/36; H01L 21/0274; H01L 27/0207

USPC ................................................ 430/5; 257/48
See application file for complete search history.

(56) References Cited

FOREIGN PATENT DOCUMENTS

TW    201213991    4/2012
TW    201442187    11/2014

OTHER PUBLICATIONS

"Office Action of Taiwan Counterpart Application", issued on May 20, 2016, p. 1-p. 6.

*Primary Examiner* — Christopher Young
(74) *Attorney, Agent, or Firm* — J.C. Patents

(57) ABSTRACT

Provided is a semiconductor structure. The semiconductor structure is formed on a substrate, and includes a first region and a second region surrounded by the first region. The first region has a first pattern density, and the second region has a second pattern density. The first pattern density is smaller than the second pattern density. The second region includes a central region and a boundary region. The central region has a first critical dimension, and the boundary region has a second critical dimension. Variation between the first critical dimension and the second critical dimension is smaller than 6.5%.

8 Claims, 5 Drawing Sheets

PHOTOMASK AND SEMICONDUCTOR STRUCTURE

BACKGROUND OF THE INVENTION

1. Field of the Invention

The invention relates to a photomask and a semiconductor structure.

2. Description of Related Art

As the critical dimension (CD) of semiconductor structures continues to be reduced, the requirement on the resolution of photolithography also becomes higher. Generally speaking, there is usually a high pattern density device region (e.g. memory cell region or array region) and a low pattern density device region (e.g. peripheral region). In a boundary region of the high pattern density device region, which is close to the low pattern density device region, holes in uneven sizes and even blind hole defects of the semiconductor structure are commonly produced due to a significant difference in pattern density. As a result, the product reliability is reduced. Thus, how to improve the uniformity of critical dimension in the boundary region and reduce the defects and blind holes in the semiconductor structure, thereby improving the product reliability, has become an important issue.

SUMMARY OF THE INVENTION

The invention provides a photomask and a semiconductor structure capable of improving uniformity of critical dimension of the photomask and the semiconductor structure.

The invention provides a semiconductor structure capable of reducing holes in uneven sizes and blind holes in the boundary region.

The invention provides a semiconductor structure adapted for structures of contact hole (C/H), line/space (L/S), iso trench, and iso line.

The invention provides a semiconductor structure formed on a substrate. The semiconductor structure includes a first region and a second region. The first region has a first pattern density. The second region has a second pattern density, wherein the first region surrounds the second region, and the first pattern density is smaller than the second pattern density, the second region includes a central region and a boundary region. The central region has a first critical dimension. The boundary region has a second critical dimension, wherein variation between the first critical dimension and the second critical dimension is less than 6.5%.

According to an embodiment of the invention, there is a distance ranging from 0.012 μm to 0.12 μm between the first region and the second region.

According to an embodiment of the invention, a width of the first region is at least 350 μm.

According to an embodiment of the invention, the second region is a memory cell array region, a memory cell region or an array region.

According to an embodiment of the invention, the second region is a memory cell array region, and a length of each pattern in the memory cell array region is from 36 nm to 120 nm, and a width thereof is from 36 nm to 120 nm.

According to an embodiment of the invention, a pitch of each pattern in the memory cell array region is from 76 nm to 240 nm.

According to an embodiment of the invention, the second region includes at least one pattern.

According to an embodiment of the invention, the at least one pattern includes an opening, a line, a sheet, or a combination thereof.

The invention provides a photomask, including a transparent substrate and a shielding layer. The shielding layer is located on the transparent substrate. The shielding layer includes a first region and a second region. The first region has a plurality of sub-resolution assist features (SRAF). The second region has a plurality of main patterns. The first region surrounds the second region, and a width of the first region is at least 1400 μm.

According to an embodiment of the invention, the second region includes a central region and a boundary region. The central region has a first critical dimension. The boundary region has a second critical dimension. Variation between the first critical dimension and the second critical dimension is less than 1.7%.

According to an embodiment of the invention, there is a distance ranging from 0.048 μm to 0.48 μm between the first region and the second region.

According to an embodiment of the invention, the second region is a memory cell array region, a memory cell region or an array region.

According to an embodiment of the invention, in the memory cell array region, a length of each pattern is from 144 nm to 480 nm, and a width thereof is from 144 nm to 480 nm.

According to an embodiment of the invention, a pitch of each pattern in the memory cell array region is from 304 nm to 960 nm.

According to an embodiment of the invention, the main patterns include at least one pattern.

According to an embodiment of the invention, the at least one pattern includes a square shape, a rectangular shape, a line shape, or a combination thereof.

According to an embodiment of the invention, the sub-resolution assist features (SRAF) include a square shape, a rectangular shape, or a line shape.

According to an embodiment of the invention, the sub-resolution assist features (SRAF) are not imaged on a substrate after exposure and development processes.

According to an embodiment of the invention, a line width of each sub-resolution assist features (SRAF) is from 60 nm to 200 nm.

According to an embodiment of the invention, an angle included between an arrangement direction of the sub-resolution assist features (SRAF) and an arrangement direction of the main patterns is from 0 to 180 degrees.

Based on the above, the photomask of the invention uses the plurality of sub-resolution assist features (SRAF) surrounding the plurality of main patterns to improve the uniformity of critical dimension between the central region and the boundary region of the plurality of main patterns and reduces production of defects and blind holes in the boundary region.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1A:
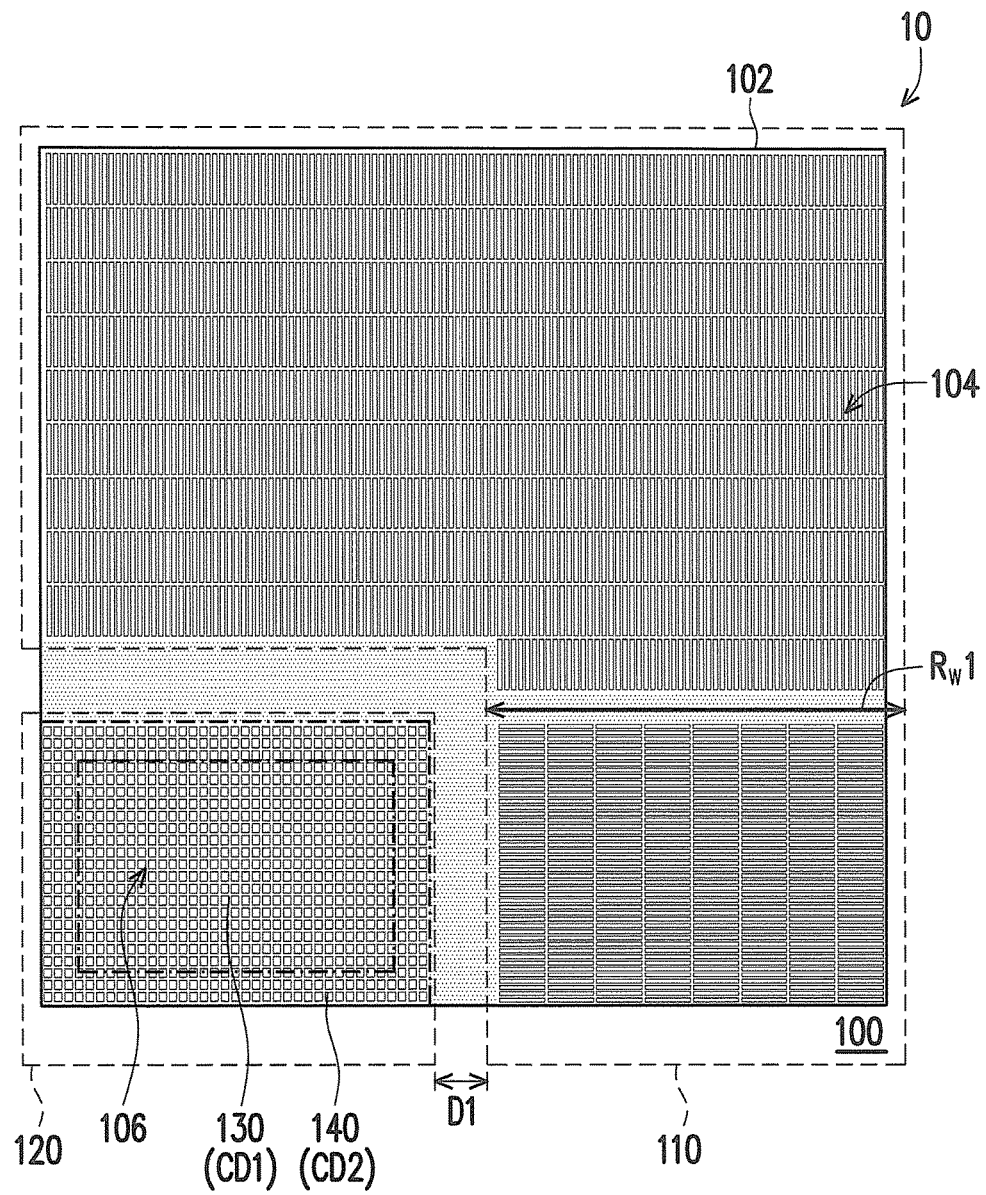
FIG. 1A is schematic view illustrating a photomask according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
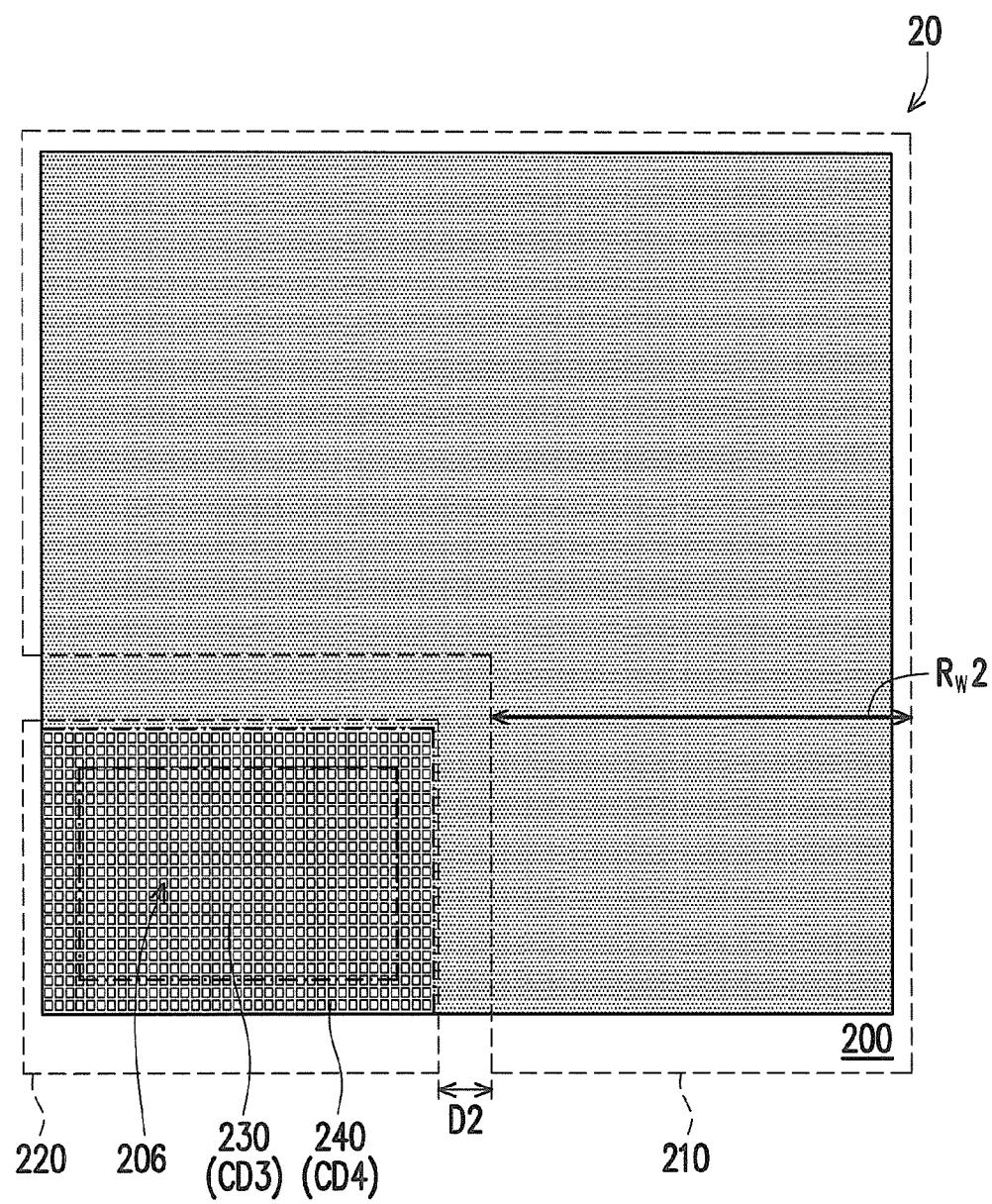
FIG. 2 is a top view illustrating a semiconductor structure formed by using the photomask shown in FIG. 1A according to an embodiment of the invention.

FIG. 1A is schematic view illustrating a photomask according to an embodiment of the invention. FIG. 2 is a top view illustrating a semiconductor structure formed by using the photomask shown in FIG. 1A according to an embodiment of the invention.

Referring to FIG. 1A, a photomask 10 of this embodiment of the invention includes a transparent substrate 100 and a shielding layer 102. The transparent substrate 100 may be glass, polymer, or other suitable transparent materials, for example. In this embodiment, a size of patterns of the photomask 10 is four times of a size of patterns to be transferred. Therefore, compared with a distance, pattern and size of a semiconductor structure 20 shown in FIG. 2, a distance, pattern and size of the photomask 10 is enlarged by four times. However, the invention is not limited thereto. In other embodiments, the distance, pattern and size of the photomask 10 may also be enlarged by one time, five times, or ten times, etc., for example.

The shielding layer 102 is located on the transparent substrate 100. In an embodiment, a material of the shielding layer 102 may be metal, such as Chrome (Cr) or other suitable materials, for example. The shielding layer 102 may be formed by depositing a shielding material layer by chemical vapor deposition or physical vapor deposition, and then patterning the shielding material layer. The chemical vapor deposition is plasma enhanced chemical vapor deposition (PECVD), low pressure chemical vapor deposition (LPCVD), etc., for example, and the physical vapor deposition is evaporation, sputtering, ion beam deposition, etc., for example.

The shielding layer 102 includes a first region 110 and a second region 120 surrounded by the first region 110. The second region 120 is a memory cell array region, a memory cell region or an array region, for example. In an embodiment, a distance D1 between the first region 110 and the second region 120 is from 0.048 µm to 0.48 µm, for example. In the first region 110, the shielding layer 102 has a plurality of sub-resolution assist features (SRAF) 104. In the second region 120, the shielding layer 102 has a plurality of main patterns 106.

The second region 120 includes a central region 130 and a boundary region 140 surrounding the central region 130. A critical dimension of the main pattern 106 in the central region 130 is CD1, and a critical dimension of the main pattern 106 in the boundary region 140 is CD2. If the second region 120 is a memory cell array region, the critical dimension CD1 and the critical dimension CD2 should, in theory, be close. However, when there is an overly significant difference in pattern density between the first region 110 and the second region 120, thereby generating a loading effect, variation between the critical dimension CD1 of the main pattern 106 in the central region 130 and the critical dimension CD2 of the main pattern 106 in the boundary region 140 increases.

In the photomask 10 of this embodiment of the invention, the plurality of sub-resolution assist features (SRAF) 104 are disposed in the first region 110 to reduce the loading effect in the first region 110 and the second region 120, thereby improving uniformity of critical dimension of patterns formed on a substrate 200 (FIG. 2) after a photolithography process and an etching process. For example, when the plurality of sub-resolution assist features (SRAF) 104 are not disposed in the first region 110, variation between the critical dimension CD1 of the main pattern 106 of the central region 130 and the critical dimension CD2 of the main pattern 106 of the boundary region 140 is 2.5%. When the plurality of sub-resolution assist features (SRAF) 104 are disposed in the first region 110 and a width $R_w1$ of the first region 110 is at least 1400 µm, the variation between the critical dimension CD1 of the main pattern 106 of the central region 130 and the critical dimension CD2 of the main pattern 106 of the boundary region 140 may be less than 1.7%. The variation described herein takes a process specification of the main patterns 106 of the central region 130 into consideration. In general, if the process specification is not considered, the critical dimension CD1 of the main pattern 106 of the central region 130 and the critical dimension CD2 of the main pattern 106 of the boundary region 140 in this embodiment may be the same.

Referring to FIG. 1A and FIG. 2, the sub-resolution assist features (SRAF) 104 in the first region 110 cannot be imaged on the substrate 200 after subsequent exposure and development processes. However, the main patterns 106 in the second region 120 are imaged on the substrate 200. In an embodiment, regions in the sub-resolution assist features (SRAF) 104 and the main patterns 106 are light-transmissive regions, while rest of the photomask 10 is an opaque region. However, the embodiments of the invention are not limited thereto. In another embodiment, it is also possible that the regions in the sub-resolution assist features (SRAF) 104 and the main patterns 106 are opaque regions, while the rest of the photomask 10 is a light-transmissive region. A line width designed for the sub-resolution assist features (SRAF) 104 small enough that the sub-resolution assist features (SRAF) 104 are not imaged on the substrate 200 after the subsequent exposure and development processes.

Figure 1B:
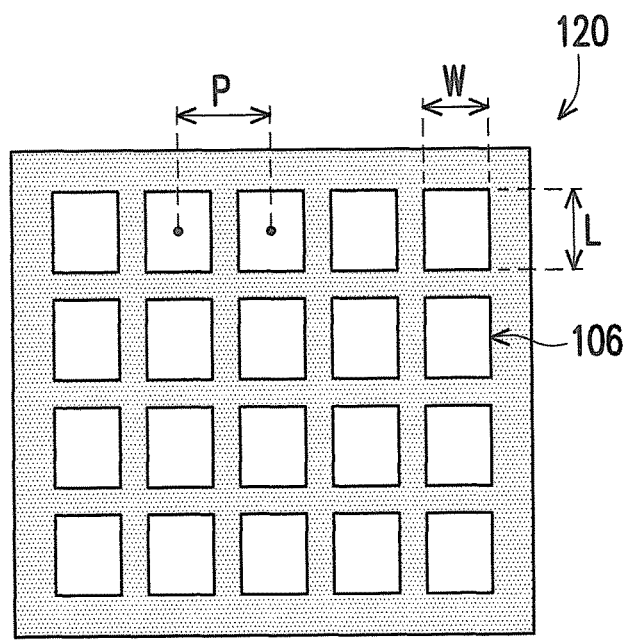
FIG. 1B is a partial enlarged view of main patterns of a second region shown in FIG. 1A.
Figure 1C:
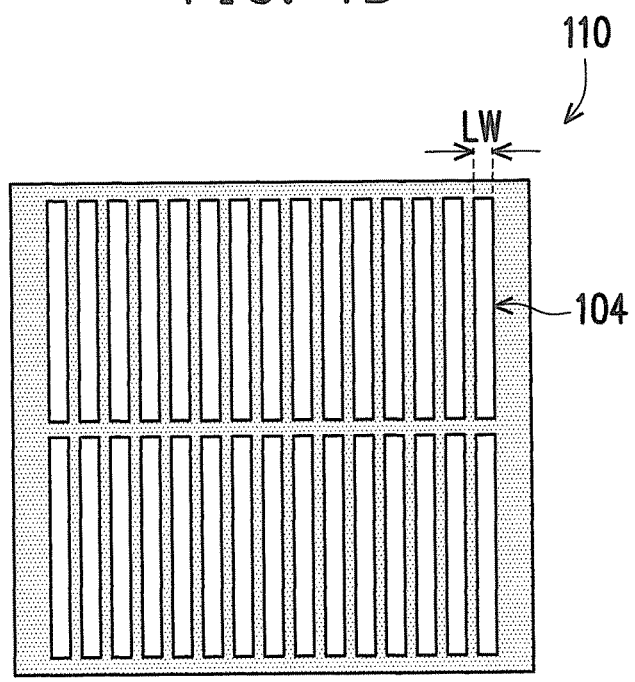
FIG. 1C is a partial enlarged view of sub-resolution assist features (SRAF) in a first region shown in FIG. 1A.

FIG. 1B is a partial enlarged view of main patterns of a second region shown in FIG. 1A. FIG. 1C is a partial enlarged view of sub-resolution assist features (SRAF) in a first region shown in FIG. 1A.

Referring to FIG. 1B, the main patterns 106 in the second region 120 may include at least one pattern. The at least one pattern may be a line, a sheet or an opening, for example. The opening may be a trench, a contact hole or a via hole. The at least one pattern may be in a shape of square, rectangle, line, or a combination thereof. In an embodiment, the second region 120 is a memory cell array region, for example. The main patterns 106 are openings, for example, and a length L of each opening pattern is from 144 nm to 480 nm, a width W thereof is from 144 nm to 480 nm, and a pitch P thereof is from 304 nm to 960 nm. However, the embodiments of the invention are not limited thereto.

As described above, since the size of the patterns of the photomask 10 in this embodiment is four times of the size of the patterns to be transferred, after the main patterns 106 of the photomask 10 are transferred to the semiconductor structure 20 shown in FIG. 2, a length of each main pattern 206 is from 36 nm to 120 nm, a width thereof is from 36 nm to 120 nm, and a pitch of each pattern is from 76 nm to 240 nm.

Referring to FIG. 1C, in an embodiment, the sub-resolution assist features (SRAF) 104 of the first region 110 include at least one pattern. The at least one pattern may be a line or an opening, for example. The at least one pattern may be in a shape of square, rectangle, line, or a combination thereof. In FIG. 1C, the sub-resolution assist features (SRAF) 104 are openings, and a line width LW of each opening is from 60 nm to 200 nm. Moreover, in an embodiment, an angle included between an arrangement direction of the sub-resolution assist features (SRAF) 104 and an arrangement direction of the main patterns 106 may be an arbitrary angle from 0 to 180 degrees. For example, in an embodiment, the main patterns 106 are rectangular or square openings, and the sub-resolution assist features (SRAF) 104 are line-shaped openings. When a first direction along long sides of the rectangular openings of the main patterns 106 is parallel to a second direction along long sides of the line-shaped openings of the sub-resolution assist features (SRAF) 104, the angle included between the arrangement direction of the sub-resolution assist features (SRAF) 104 and the arrangement direction of the main patterns 106 is 0 degrees. However, if the first direction along the long sides of the rectangular openings of the main patterns 106 and the second direction along the long sides of the line-shaped openings of the sub-resolution assist features (SRAF) 104 are perpendicular to each other, the angle included between the arrangement direction of the sub-resolution assist features (SRAF) 104 and the arrangement direction of the main patterns 106 is 90 degrees.

FIG. 2 is a top view illustrating a semiconductor structure formed by using the photomask shown in FIG. 1A according to an embodiment of the invention.

Referring to FIG. 2, the semiconductor structure 20 is formed on the substrate 200 by performing the photolithography and etching processes to the substrate 200 using the photomask 10 (FIG. 1A) of the invention as a mask. The substrate 200 is a semiconductor substrate, a semiconductor compound substrate, or a semiconductor over insulator (SOI) substrate, for example. The semiconductor may be atoms of IVA Group, such as silicon or germanium, for example. The semiconductor compound is a semiconductor compound formed by atoms of IVA Group, such as silicon carbide or silicon germanium, for example, or a semiconductor compound formed by atoms of IIIA Group or atoms of VA Group, such as gallium arsenide, for example.

The semiconductor structure 20 includes a first region 210 and a second region 220. The first region 210 surrounds the second region 220. In an embodiment, a distance D2 between the first region 210 and the second region 220 is from 0.012 μm to 0.12 μm. The first region 210 has a first pattern density, and the second region 220 has a second pattern density. The first pattern density is smaller than the second pattern density. The second region 220 includes a central region 230 and a boundary region 240. A component in the central region 230 has a critical dimension CD3. A component in the boundary region 240 has a critical dimension CD4. The second region 220 is a memory cell array region, a memory cell region or an array region, for example. Patterns in the second region 220 may include at least one pattern. The at least one pattern may include an opening, a line, a sheet, or a combination thereof.

In the conventional technology, the first pattern density of the first region 210 is smaller than the second pattern density of the second region 220, which results in greater variation between the critical dimension CD3 of the central region 230 and the critical dimension CD4 of the boundary region 240. However, referring to FIGS. 1A and 2, in this embodiment of the invention, after performing the photolithography and etching processes to the substrate 200 using the photomask 10 (where the plurality of sub-resolution assist features (SRAF) 104 are disposed surround the plurality of main patterns 106) as a mask, a loading effect between the first region 210 and the second 220 may be reduced, thereby improving uniformity of the critical dimension CD3 of the central region 230 of the second region 220 and the critical dimension CD4 of the boundary region 240 of the second region 220. In an example, when the width $R_w1$ of the first region 110 of the photomask 10 shown in FIG. 1A of the invention is 1400 μm, the variation between the critical dimension CD3 of the central region 230 and the critical dimension CD4 of the boundary region 240 may be less than 6.5% after performing the photolithography process and the etching process to the substrate 200. For the semiconductor structure formed without disposing the sub-resolution assist features (SRAF) in the conventional technology, the variation between the critical dimension of the central region and the critical dimension of the boundary region thereof is approximately 20%. However, in the embodiments of the invention, the variation between the critical dimension CD3 of the central region 230 of the semiconductor structure 20 and the critical dimension CD4 of the boundary region 240 of the semiconductor structure 20 may be less than 6.5%. Therefore, the embodiments of the invention have more preferable uniformity of critical dimension of the patterns in the semiconductor structure 20. In an embodiment of the invention, a width Rw2 of the first region 210 of the semiconductor structure 20 shown in FIG. 2 of the invention is 350 μm. It should be understood that the variation described herein takes the process specification into consideration. In general, if the process specification is not considered, the critical dimension CD3 of the main pattern 206 of the central region 230 and the critical dimension CD4 of the main pattern 206 of the boundary region 240 in the semiconductor structure 20 of this embodiment may be the same.

Besides, when the variation between the critical dimension CD1 and the critical dimension CD2 of the photomask 10 according to this embodiment of the invention is reduced, the variation between the critical dimension CD3 and the critical dimension CD4 of the semiconductor structure 20 of this embodiment of the invention is reduced as well. Therefore, the uniformity between the critical dimension CD3 and the critical dimension CD4 of the boundary region 240 may be improved, thereby further reducing production of defects and blind holes in a boundary region 240 between the first region 210 and the second region 220.

Figure 3:
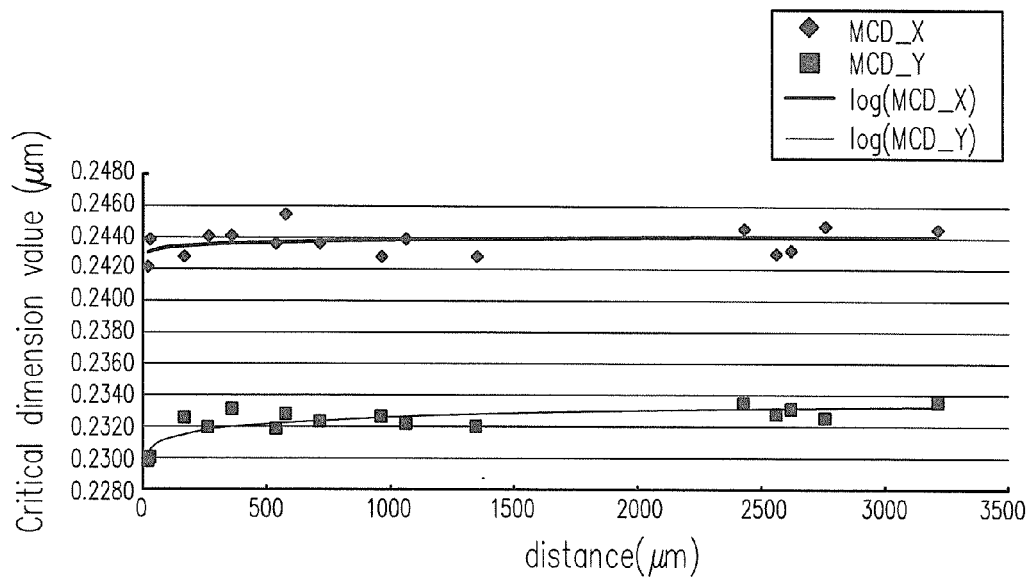
FIG. 3 is a diagram illustrating values of critical dimension of main patterns in a photomask of Comparative Example 1 from a corner of a boundary region to a central region.
Figure 4:
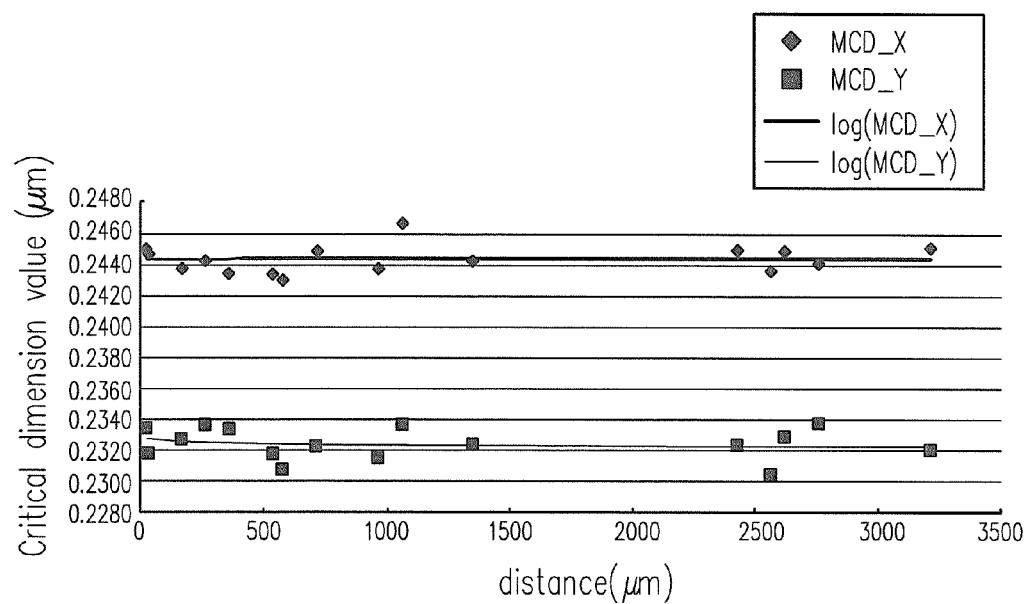
FIG. 4 is a diagram illustrating values of critical dimension of main patterns in a photomask of Experimental Example 1 of the invention from a corner of a boundary region to a central region.

FIG. 3 is a diagram illustrating variation in critical dimension of main patterns in a photomask of Comparative Example 1 from a corner of a boundary region to a central region. In Comparative Example 1, only the second region has a plurality of main patterns, and the first region does not have sub-resolution assist features (SRAF). FIG. 4 is a diagram illustrating variation in critical dimension of main patterns in a photomask of Experimental Example 1 of the invention from a corner of a boundary region to a central region. A second region of the photomask of Experimental Example 1 has a plurality of main patterns, and a first region surrounding the second region has a plurality of sub-resolution assist features (SRAF). In addition, a width of the first region having the plurality of sub-resolution assist features (SRAF) is 500 μm.

Based on the results shown in FIG. 3, in Comparative Example 1, when the second region is a memory cell array region, and a critical dimension of each pattern is 244×232 nm, curves close to the boundary region are steeper and the variation in critical dimension between the boundary region and the central region of the photomask is approximately 2 nm to 3 nm. On the other hand, based on the results shown in FIG. 4, curves indicating the critical dimensions of the boundary region and the central region of the photomask in Experimental Example 1 are flatter, indicating that there is no substantial difference in critical dimension between the boundary region and the central region of the photomask. It is clearly shown that the variation in critical dimension between the boundary region and the central region of the photomask is greater in Comparative Example 1, while the uniformity of critical dimension between the boundary region and the central region of the photomask in Experimental Example 2 is more preferable.

In another Experimental Example, a target critical dimension (target MCD) on a horizontal axis (X direction) in the photomask is 244 nm, and the target critical dimension on a vertical axis (Y direction) in the photomask is 232 nm. When the plurality of sub-resolution assist features (SRAF) are not disposed in the first region of the photomask, an actual critical dimension on the horizontal axis (X direction) in the second region is from 246.6 nm to 242.1 nm (i.e. variation of the actual critical dimension with respect to the target critical dimension is 4.5 nm), the actual critical dimension on the vertical axis (Y direction) in the second region is from 234.5 nm to 229.3 nm (i.e. the variation of the actual critical dimension with respect to the target critical dimension is 5.2 nm), and the pattern density in the second region is 23.2%. However, when the plurality of sub-resolution assist features (SRAF) are disposed in the first region of the photomask, the actual critical dimension on the horizontal axis (X direction) in the second region is from 247.2 nm to 243.7 nm (i.e. the variation of the actual critical dimension with respect to the target critical dimension is 3.5 nm), and the actual critical dimension on the vertical axis (Y direction) in the second region is 235.3 nm to 231.7 nm (i.e. the variation of the actual critical dimension with respect to the target critical dimension is 3.6 nm), and the pattern density in the second region is 30.4%. It can be seen that the range of the mask critical dimension (MCD) in the second region is improved to 3.6 nm from 5.2 nm when the mask pattern density in the second region is increased to 30.4% from 23.2% by disposing the plurality of sub-resolution assist features (SRAF) surrounding the plurality of main patterns in the photomask of the invention. Therefore, by using the photomask of the invention, not only the uniformity in the second region is improved, but the pattern density in the second region is also increased. As a result, the integration of the device is increased.

Figure 5:
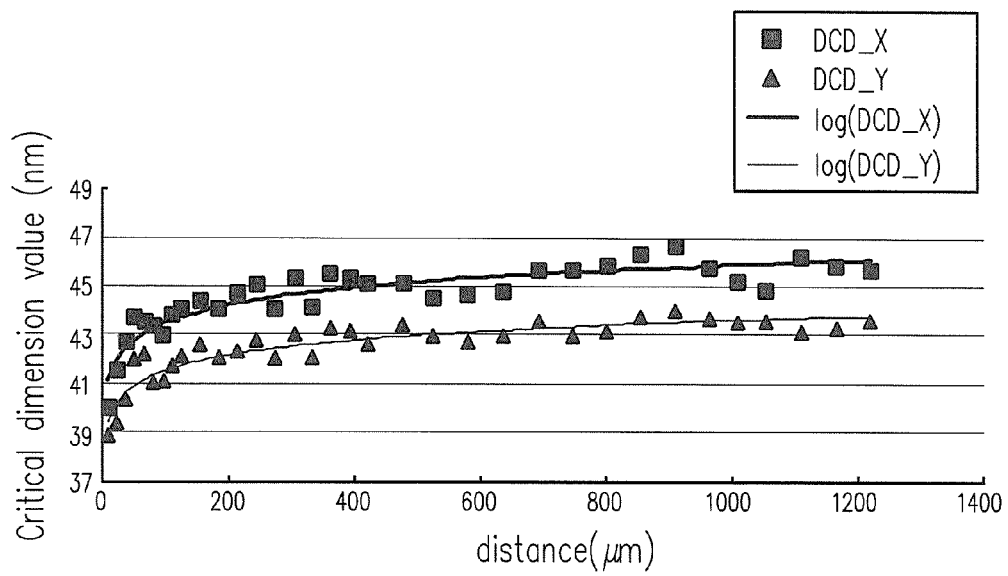
FIG. 5 is a diagram illustrating values of critical dimension of a semiconductor structure of Comparative Example 2 from a corner of a substrate boundary region to a central region.
Figure 6:
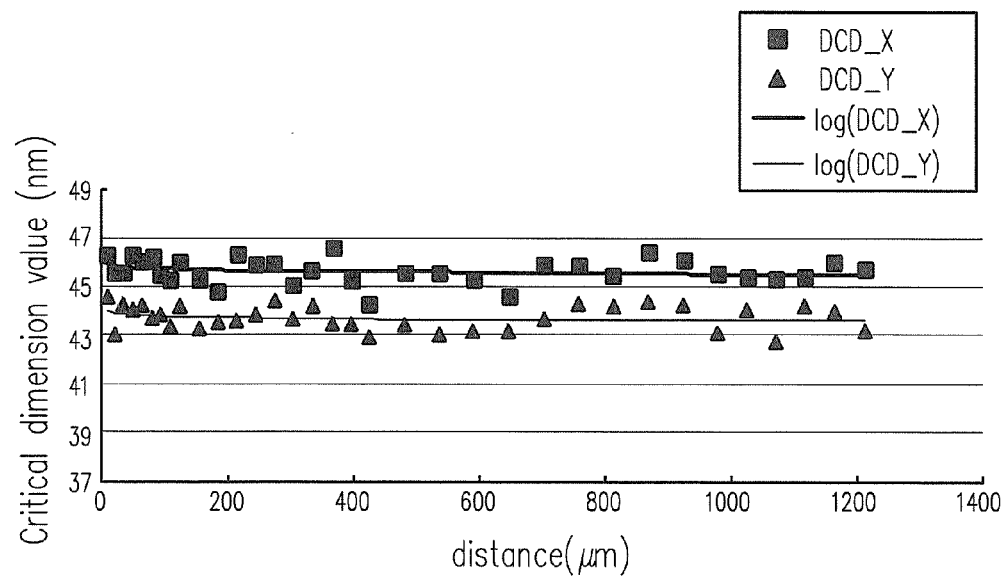
FIG. 6 is a diagram illustrating values of critical dimension of a semiconductor structure of Experimental Example 2 of the invention from a corner of a substrate boundary region to a central region.

FIG. 5 is a diagram illustrating variation in critical dimension of a semiconductor structure of Comparative Example 2 from a corner of a substrate boundary region to a central region. The semiconductor structure is formed on the substrate after performing the photolithography and etching processes using the photomask of Comparative Example 1 as a mask. FIG. 6 is a diagram illustrating variation in critical dimension of a semiconductor structure of Experimental Example 2 of the invention from a corner of a substrate boundary region to a central region. The semiconductor structure is formed on the substrate after performing the photolithography and etching processes using the photomask of Experimental Example 1 as a mask.

Based on the results shown in FIG. 5, in Comparative Example 2, when the second region is a memory cell array region, and a critical dimension of each pattern is 46×43 nm, the variation in critical dimension between the boundary region and the central region of the semiconductor structure is approximately 4 nm to 6 nm. Clearly, curves indicating the boundary region are steeper, and the variation is very significant. On the other hand, curves indicating the critical dimensions of the boundary region and the central region of the semiconductor structure of Experimental Example 2 are flatter, indicating that there is no substantial difference in critical dimension between the boundary region and the central region. It is clearly shown that the variation in critical dimension between components in the boundary region and the central region is greater in Comparative Example 2, while the uniformity of critical dimension between the components in the boundary region and the central region is more preferable in Experimental Example 2.

In view of foregoing, the plurality of sub-resolution assist features (SRAF) are disposed to surround the plurality of main patterns in the photomask of the invention. Therefore, the loading effect between the first region and the second region may be reduced, thereby reducing the variation in critical dimension between the central region and the boundary region of the second region. Then, using the photomask according to the embodiments of the invention as a mask, the photolithography and etching processes are performed, such that the variation in critical dimension between the central region and the boundary region in the second region of the semiconductor structure is less than 6.5%. Thus, the invention not only improves the uniformity of critical dimension of the photomask and semiconductor structure, but also reduces production of defects and blind holes in the boundary region of the semiconductor structure. The product reliability is consequently improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure, formed on a substrate, the semiconductor structure comprising:
   a first region, having a first pattern density; and a second region, having a second pattern density, wherein the first region surrounds the second region, and the first pattern density is smaller than the second pattern density,
wherein the second region comprises:
a central region, having a first critical dimension; and
a boundary region, having a second critical dimension, wherein variation between the first critical dimension and the second critical dimension is less than 6.5%.

2. The semiconductor structure as claimed in claim 1, wherein there is a distance ranging from 0.012 µm to 0.12 µm between the first region and the second region.

3. The semiconductor structure as claimed in claim 1, wherein a width of the first region is at least 350 µm.

4. The semiconductor structure as claimed in claim 1, wherein the second region is a memory cell array region, a memory cell region or an array region.

5. The semiconductor structure as claimed in claim 1, wherein the second region is a memory cell array region, and a length of each pattern in the memory cell array region is from 36 nm to 120 nm, and a width thereof is from 36 nm to 120 nm.

6. The semiconductor structure as claimed in claim 5, wherein a pitch of each pattern in the memory cell array region is from 76 nm to 240 nm.

7. The semiconductor structure as claimed in claim 1, wherein the second region comprises at least one pattern.

8. The semiconductor structure as claimed in claim 7, wherein the at least one pattern comprises an opening, a line, a sheet, or a combination thereof.

* * * * *